United States Patent
Kirihata et al.

[19]

[11] Patent Number: 6,166,981
[45] Date of Patent: Dec. 26, 2000

[54] METHOD FOR ADDRESSING ELECTRICAL FUSES

[75] Inventors: Toshiaki Kirihata, Poughkeepsie; Gabriel Daniel, Jamaica Estates, both of N.Y.

[73] Assignee: International Business Machines Corporation, Armonk, N.Y.

[21] Appl. No.: 09/512,922

[22] Filed: Feb. 25, 2000

[51] Int. Cl.[7] .................................................. G11C 7/00
[52] U.S. Cl. ...................................... 365/225.7; 365/200
[58] Field of Search ............................... 365/200, 225.7, 365/230.06, 201

[56] References Cited

U.S. PATENT DOCUMENTS

| | | | |
|---|---|---|---|
| 6,067,268 | 5/2000 | Lee | 365/225.7 |
| 6,088,281 | 7/2000 | Miyakawa et al. | 365/225.7 |
| 6,094,386 | 7/2000 | Kohyama | 365/200 |

*Primary Examiner*—Son Mai
*Attorney, Agent, or Firm*—H. Daniel Schnurmann

[57] ABSTRACT

A memory device that includes a plurality of data storage cells; at least one redundancy data storage cell; a redundancy match detection circuit; and a means for coupling programmable fuses to the redundancy match detection circuit, wherein a defective data storage is replaced by one redundancy data storage when the redundancy match detection detects a pre-determined condition set by said programmable fuse is described. Decoding is accomplished by a data bus selecting the e-fuse to be blown. The data bus is also used for reading the state of the e-fuses to ensure that the e-fuses are correctly blown. Power is effectively applied to the selected e-fuses while sharing the data bus for e-fuse decoding and verification. In order to reduce the number of communication channels between e-fuses and the redundancy match detection circuitry, the transfer operation uses time multiplexing, allowing e-fuse information to be transferred to the redundancy match detection circuitry sequentially. The actual time multiplexing operation for performing the transfer is preferably enabled only after the chip power-up state.

22 Claims, 7 Drawing Sheets

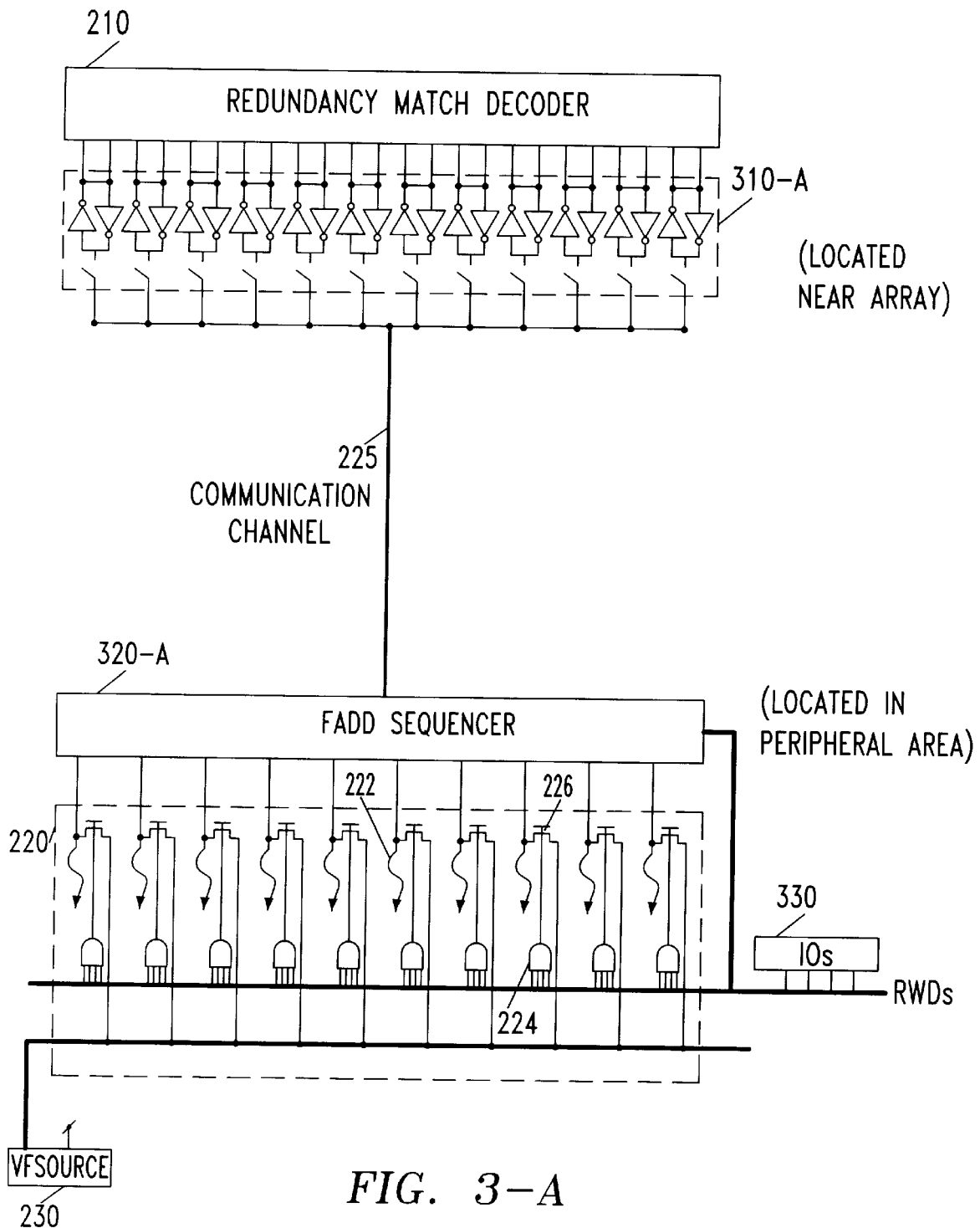
FIG. 3-A

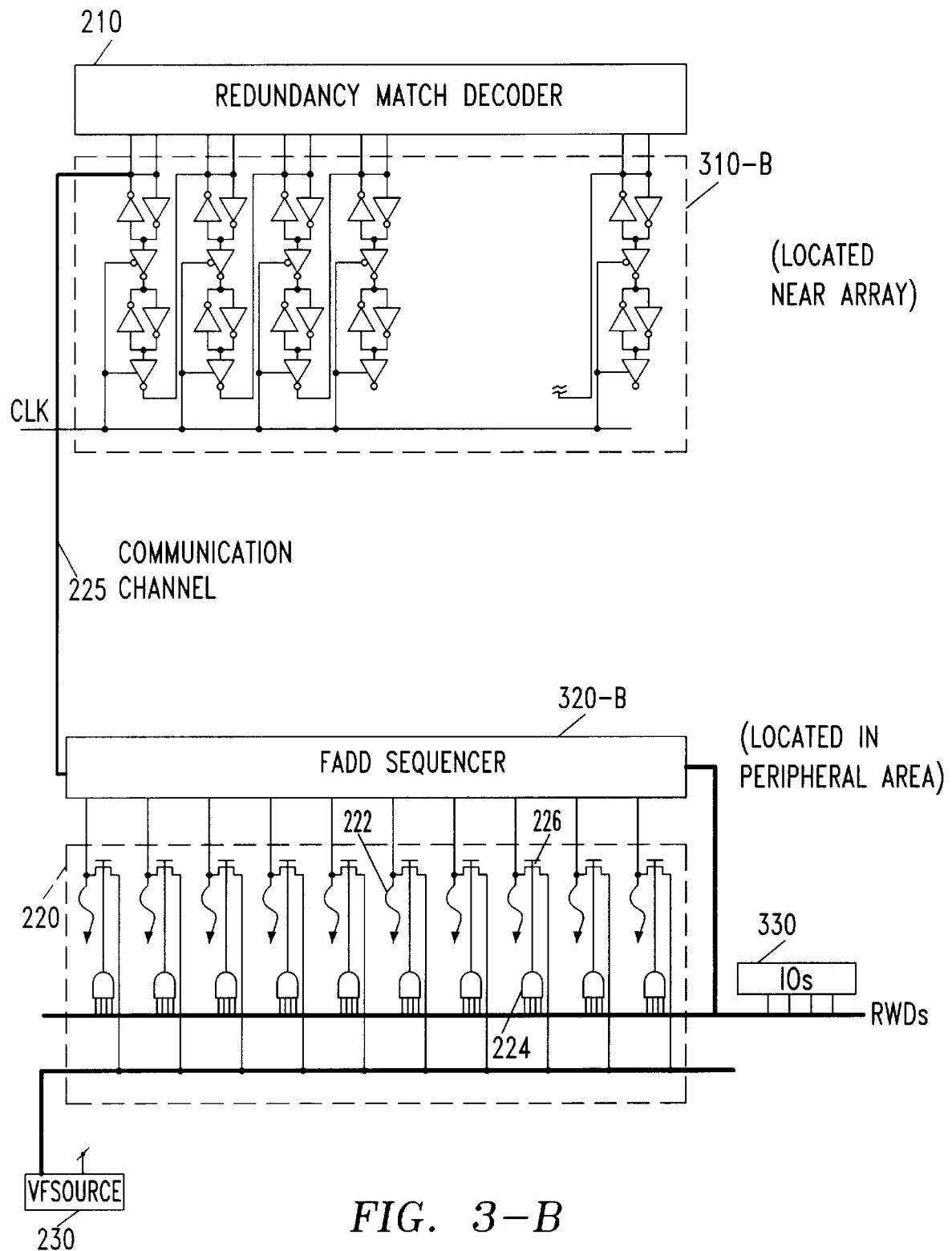
FIG. 3-B

METHOD FOR ADDRESSING ELECTRICAL
FUSES

FIELD OF THE INVENTION

This invention generally relates to a redundancy replacement architecture for memory devices, and more particularly, to an electrically programable redundancy replacement configuration applicable to large scale memories.

BACKGROUND OF THE INVENTION

CMOS technology has evolved such that the computer market has rapidly opened to a wide range of consumers. Today multi-media requires at least a 64 MB, and preferably even a 128 MB memory, which increases the relative cost of the memory system within the computer. In the near future, it is likely that 256 MB and 512 MB computers will become commonplace, which suggests a potential strong demand for 256 Mb DRAMs (Dynamic Random Access Memory) and beyond. Still in the development stage, DRAMs in the Gigabit range are already under way. As DRAM density and lithographic difficulties increase, it is more difficult to have a fully functional DRAMs. This necessitates the introduction of new techniques that guarantee a reasonable chip yield notwithstanding the added complexity of the design and manufacture of such memory devices. Process and design engineers are continuously attempting to reduce and, ultimately, eliminate mask defects. Faults that inevitably remain in the chip are generally overcome using special circuit designs, and, more specifically, redundancy replacement.

A conventional redundancy replacement architecture of a memory is shown in FIG. 1. Memory chip (100) includes a plurality of elements (112) in at least one array (110) supported by a plurality of decoders (120) that select a corresponding element (112) with the address inputs (ADDs). The element is selected when the STROBE signal switches to high, activating the element (112) by way of a corresponding decoder (122). In order to implement a redundancy replacement architecture, array (110) additionally includes at least one redundancy element (RE 114). More particularly, RE (114) replaces the element (112) having the fault (labeled X) with the selection of the switch being controlled by a redundancy circuit (130). Redundancy circuit (130) includes a plurality of laser fuses (132) that identify the (redundancy) addresses of the corresponding faulty elements, and generate a redundancy match detection signal (RMD). In order to program this address, selected laser fuses are blown at wafer level before the chip is mounted on the next level of packaging, e.g., a multi-chip module. Thus, when the input addresses (ADDs) match the programed redundancy address, the signal RMD shifts to a high. Moreover, in order not to activate the element (112) having a fault when STROBE switches to high, the decoder (122) requires to be disabled. The high state of RMD, on the other hand, enables redundancy decoder (124) to activate RE (114) when STROBE switches to high. This redundancy replacement method effectively overcomes the functionality problem even in the presence of a defective element at wafer level. However, any further defects occurring subsequently up to and including the final packaging of the chip are not repaired, because further of redundancy addresses by laser is no longer possible at module level. This results in a yield loss.

It is known in the art that electrically programmable fuses (e-fuses) make it possible to blow fuses electrically, an ideal solution for module level redundancy. FIG. 2 shows a typical redundancy circuit (130) provided with e-fuses. Redundancy circuit (130) consists of an e-fuse block (220) and a redundancy match detection decoder (210). The e-fuse block (220) consists of a plurality of e-fuses (222) and e-fuse decoders (224). The e-fuses (222) are programmed to identify redundancy addresses of the faulty elements, analogous to the laser programmable fuses. Unlike the laser programmable fuses, e-fuses (222) are blown by applying a large voltage to the fuse selected. The e-fuse decoders (224) interpret the address inputs (ADDs) and determine which e-fuse (222) are to be programmed. The example shown in FIG. 2 illustrates how e-fuse decoder (224-A) selects e-fuse (222-A) by opening a corresponding NMOS (226-A). As a result, a large current (I) flows from the high voltage supply (VSOURCE) to ground through the selected e-fuse (222-A) when the VSOURCE switches to high. The high voltage is typically supplied from the high voltage generator (230). The power (P) applied to the e-fuse with resistance (R) is determined by $P=I^2R$. If P is sufficiently large at a given spot of the e-fuse, the e-fuse conductivity is severed. This process is repeated for blowing other e-fuses to identify the redundancy addresses.

OBJECTS OF THE INVENTION

Accordingly, it is an object of the preset invention to provide an effective method for decoding fuses by applying power to selected fuse, blowing the fuse reliably, and verifying the results.

It is another object of the invention to restructure the chip architecture by incorporating electrically programmable fuses for module level redundancy.

It is a further objective of the invention to provide a simple and efficient method of providing a high voltage adequate for blowing the e-fuses.

It is yet another objective of the invention to provide a simple and efficient method to verify the state of the programmed e-fuses.

SUMMARY OF THE INVENTION

In a first aspect of the invention there is provided a memory device that includes a plurality of data storage cells; at least one redundancy data storage cell; a redundancy match detection circuit; and a means for coupling programmable fuses to the redundancy match detection circuit, wherein a defective data storage is replaced by one redundancy data storage when the redundancy match detection detects a pre-determined condition set by said programmable fuse.

An e-fuse block coupled to redundancy match detection circuitry is physically allocated to different sections of a chip sharing redundancy address information between the two. Decoding is accomplished by a data bus selecting the e-fuse to be blown. The data bus is also used for reading the state of the e-fuses to ensure that the e-fuses are correctly blown. Power is effectively applied to the selected e-fuses while sharing the data bus for e-fuse decoding and verification. The redundancy match detection decoder is positioned preferably near the array to ensure a high speed operation. In order to reduce the number of communication channels between e-fuses and the redundancy match detection circuitry, the transfer operation uses time multiplexing, allowing e-fuse information to be transferred to the redundancy match detection circuitry sequentially. The actual time multiplexing operation for performing the transfer is preferably enabled only after the chip power-up state.

BRIEF DESCRIPTION OF THE DRAWINGS

The foregoing and other objects, aspects and advantages of the invention will be better understood from the following detailed description of a preferred embodiment of the invention when taken in conjunction with the accompanying drawings, in which:

FIG. 3A shows a first preferred embodiment of the memory device in accordance with the present invention;

FIG. 3B shows an alternative method of communicating the fuse information by using a shift register, wherein a sequencer transfers programmed e-fuse information serially to a shift register during every clock cycle, according to the invention;

PREFERRED EMBODIMENT OF THE INVENTION

Figure 1:
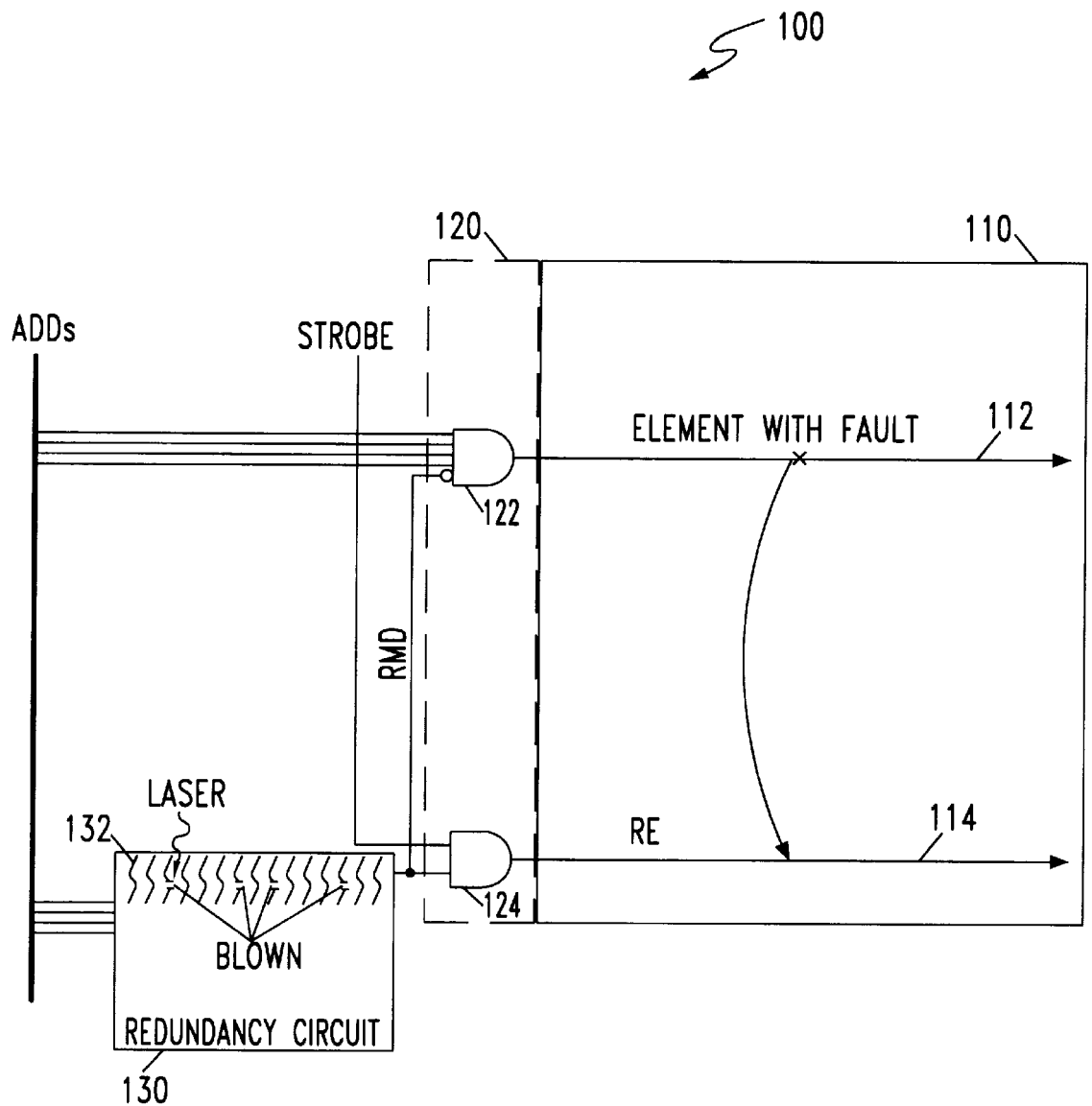
FIG. 1 shows a conventional redundancy replacement architecture of a memory that includes an array supported by decoders that select corresponding memory elements by way of address inputs.
Figure 2:
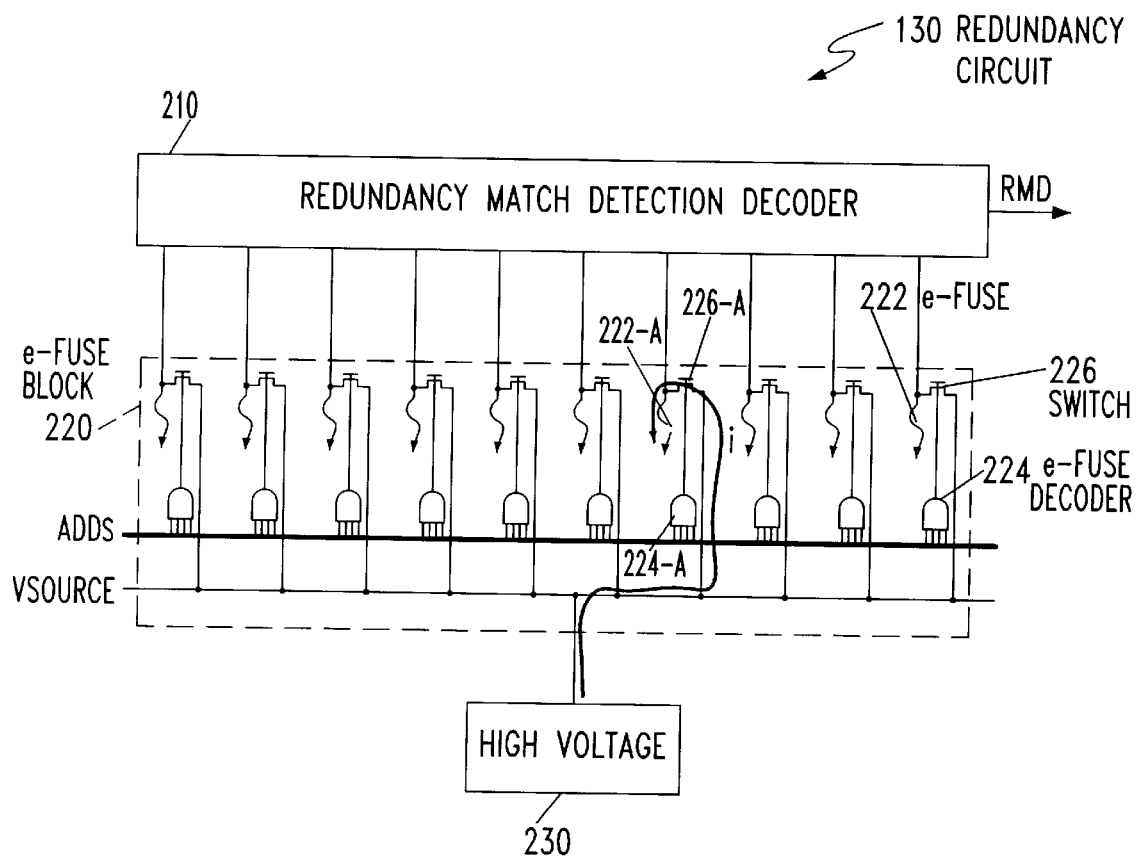
FIG. 2 shows a typical redundancy circuit provided with electrically programmable fuses.

FIG. 3A shows a first preferred embodiment of the invention. Unlike existing e-fuse architectures, a redundancy match detection decoder (210) coupled to an e-fuse block (220) are placed near the array, preferably, at the periphery of the chip. The redundancy match detection decoder (210) and the e-fuse bank (220) are coupled to a communication channel (225). More particularly, the e-fuse bank (220) consists of a plurality of e-fuses (222). Unlike the conventional approach, the input of the e-fuse decoders (224) use a plurality of Read/ Write Data bus (RWDs 235). Thus, the selection of e-fuses to be blown is determined by the RWDs buses which are coupled to corresponding input and output ports (I/Os). The I/O terminals and RWDs are common to the memory cell read/ write operation, as it is known in a conventional memory. More particularly, while in memory write mode, the data from the I/O ports is transferred to the corresponding RWDs, allowing the data to be written to the memory array (not shown). During the read mode operation, data is read from the memory array to the RWDs, outputting the data from the corresponding I/O ports. The memory array read/write mode operations are typical of conventional memory. Unlike the conventional memory chip, the present invention is provided with an added e-fuse programmed mode. The e-fuse block (220) is preferably arranged at the preferably in the area containing the RWD bus. When the e-fuse programming mode is enabled, decoder (224) selects at least one e-fuse to be blown. By using a conventional write mode operation, the data pattern on the RWDs can be controlled by the I/O ports so that the corresponding e-fuse is blown when required. The actual programming is enabled by selecting the corresponding e-fuse (222) and by boosting the high voltage supply (VFSOURCE 230), the sequence of which is made by design choice. Regardless of which design is elected, a large current flows only through selected e-fuses, blowing them. The e-fuse block (220) additionally contains a sequencer (320-A) to transfer the programed e-fuse information to the redundancy match detection decoders (210) by way of registers (310-A).

Communication is preferably enabled in a time multiplexing mode. More practically, the e-fuse programming information (such as blown or not blown) is sequentially transferred, via at least one communication channel to the corresponding registers (310-A), and preferably during the power-on phase. Optionally, the device can have a special mode for transferring the e-fuse information from thee-fuse block (220) to the redundancy match detection decoders (210). The time multiplexed transfer in coordination with the sequencer (320-A) and the registers (310-A) reduces the number of communication channels required between e-fuse block (220) and redundancy match detection decoder (210). Redundancy replacement is controlled by the redundancy match detection decoders (210) with the data stored in the registers (310-A).

FIG. 3B shows an alternate method of communicating the fuse information by using shift register method. The sequencer (320-B) transfers programmed e-fuse information serially to the register (310-B) configured as typical shift register circuitry during every clock cycle. Regardless of which time multiplexing approach or shift register method is used, a key feature of the present invention is to transfer programmed e-fuse information from e-fuse block (320-B) to redundancy match decoder (210). Optionally, the address wires can be used for the input of the e-fuse decoders (224), if the e-fuse block (220) are arranged near address area.

Figure 4:
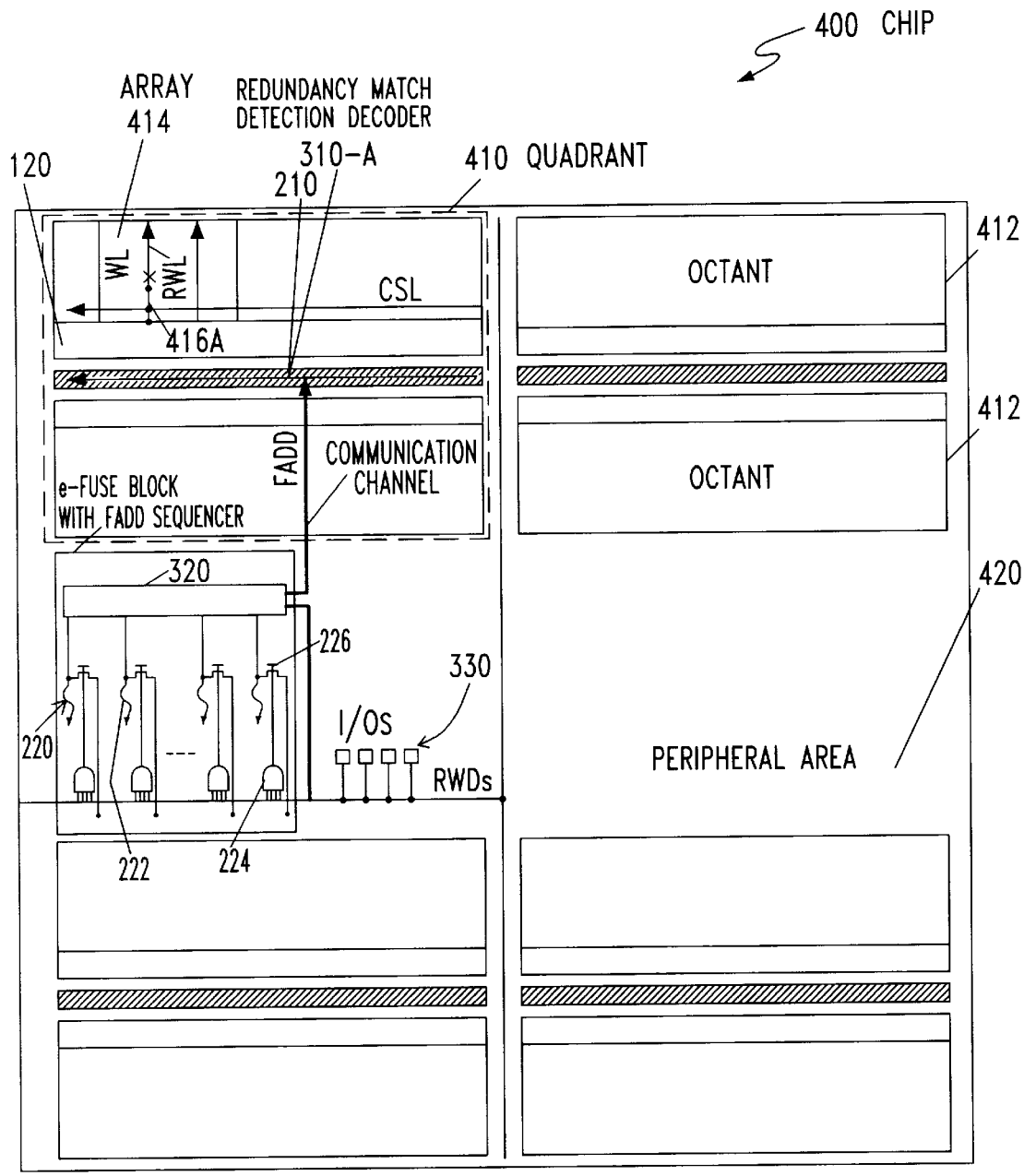
FIG. 4 shows a floor plan applicable to the memory with e-fuse redundancy of the invention, in which the memory chip is divided in four quadrants, each containing two octant, with each octant including at least one memory array.

FIG. 4 shows a preferred floor plan applicable for memory with e-fuse redundancy. The memory chip (400) consists of four quadrants (410), each containing two octant (412). Each octant (412) consists of at least one memory array (414). A plurality of memory cells (416) are arranged in each memory array (414). Data in the memory cells (416-A) is read or written by activating a wordline (WL) which selects at least one row of the memory array (414), and column select lines (CSL) in order to designate at least one column of the memory array (414). This allows data in the memory cell (416-A) to be read through the Read/Write-Data bus (RWD) to the I/Os (330) when in read mode, or vice-versa when in the write mode.

As discussed in the Background of the Invention, a redundancy replacement is enabled when a cell is found to be defective. For simplicity sake, the following discussion assumes a wordline redundancy replacement provided with an e-fuse. However, the present invention is applicable to a column redundancy replacement architecture or even to a single bit replacement with e-fuses, which is also the claim of this invention as long as the similar architecture is applied.

Chip (400) couples e-fuse block (220) to sequencer (320), preferably positioned in the peripheral area (420) of the chip, and more particularly in the I/O area having RWDs. A redundancy match detection decoders (210) with registers (310) located in the octant are preferably arranged in the row decoder area (120) located within the quadrant (410). As described previously, the e-fuse block (220) contains a plurality of e-fuses (222) and e-fuse decoders (224). This configuration is similar to that shown in FIG. 3. The address which activates the WL having a defective cell is programmed by blowing the corresponding e-fuses (222). The method of finding a WL with a defective cells is well known, and will not be discussed herein. The e-fuse information programmed in the e-fuse block (220) is then transferred to register (310). The detailed operation for e-fuse programming and the communication will now be discussed hereinafter.

Figure 5:
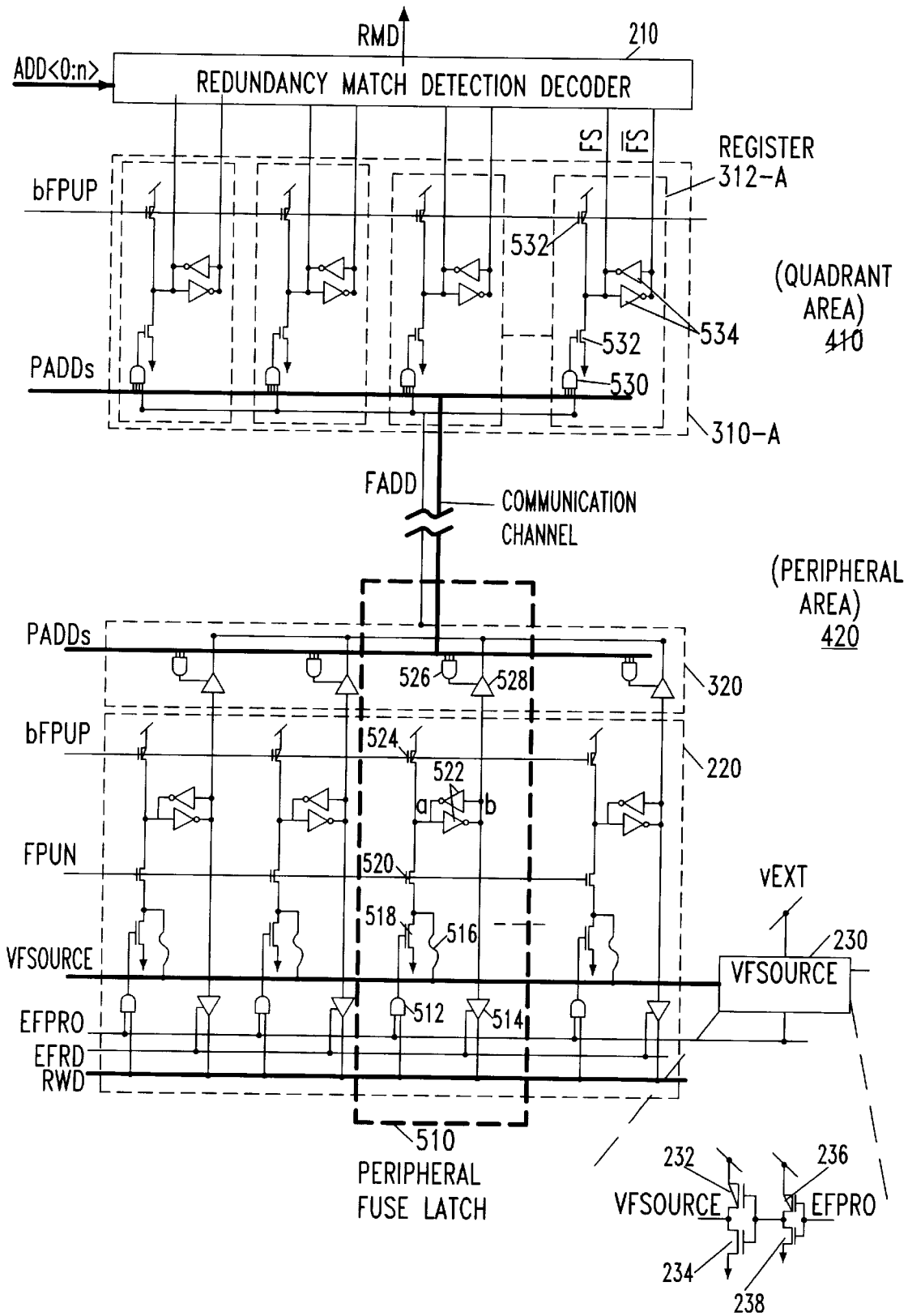
FIG. 5 is a schematic representation of the preferred embodiment of the invention seen at the transistor level, showing details of the e-fuse block, the sequencer, the redundancy match detection decoders and the register.

FIG. 5 is a schematic representation of the preferred embodiment of the present invention seen at the transistor level. The scheme shows the details of the e-fuse block (220) and sequencer (320) in FIG. 4. They are located at the peripheral area (420). The scheme also shows the details of the redundancy match detection decoders (210) and register block (310-A). They are positioned preferably between octant near row decoders. As discussed previously, the key of the present invention allows e-fuses to be blown in the fuse block (220), the results of which are transferred to registers block (310-A). Actual redundancy replacement is controlled by the fuse states copied in a plurality of registers (312-A) in the register block (310-A).

The present inventions enables five modes: (1) e-fuse programming mode, (2) e-fuse read mode, (3) e-fuse information communication mode, (4) e-fuse redundancy replacement mode, and (5) e-fuse verification mode, the details of which are discussed next.

(1) e-fuse Programming Mode:

An e-fuse block (220) with a sequencer (320) consisting of a plurality of peripheral fuse latches (510) is illustrated with each fuse latch (510) including an e-fuse (516), an e-fuse decoder (512), and switching NMOS device (518). RWD buses are used to blow the e-fuse. As discussed previously, the RWD pattern is controlled by the data pattern on I/Os when the chip is in write mode. A signal EPRO (e-fuse program) switches to high after the data pattern on the RWDs has been determined. During this programming operation, the signal FPUN remains at low, isolating the CMOS latch (522) from the e-fuses. A transition to a high EPRO opens the corresponding switch (518) selected by the e-fuse decoder (512), coupling the first node of the selected e-fuse (516) to ground. Simultaneously, the second node voltage (VFSOURCE) of the e-fuse, common to all e-fuses, is increased. In this example, two inverters connected in series, NMOSs 234 and 238, and PMOSs 232 and 236 are used by the high voltage generator (VFSOURCE 230). Note that the source of the PMOS devices are coupled to Vext which acts as a high voltage generator by increasing the VFSOURCE voltage to Vext. This allows current to flow on the selected e-fuse, resulting in it being blown. A similar procedure is enabled for other fuses for blowing.

(2) e-fuse Read Mode

The state of the e-fuse is read out to CMOS latch (522), preferably during power-up phase. Signals FPUN, bFPUP, and VFSOURCE remain at 0 v until the power supply reaches a level sufficiently high for activating CMOS logic. Node 'a' is pre-charged by PMOS (524). Signal bFPUP switches to high, disabling the pre-charge operation of node 'a'. The voltage of node 'a' is maintained by CMOS latch (522). The signal FPUN is then periodically turned-on. The voltage of node 'a' is thus dependent on the state of the e-fuse. When the e-fuse is not blown, node 'a' is discharged through e-fuse (516) to a grounded VFSOURCE. When the e-fuse is blown, node 'a' is maintained at high by CMOS latch (522). In summary, the state of the e-fuses is provided by CMOS latch (522), leaving the node at low if the e-fuse is not blown, or at high if the e-fuse is programmed.

(3) e-fuse Information Communication Mode

The detailed operation of the time multiplexing operation will now be discussed and will be shown to be similar to the discussion associated with FIG. 3A. Note that a shift register, as shown in FIG. 3B can be used with equal success. After successfully reading the state of the e-fuse, the states of the fuse are sequentially transferred to a plurality of registers (312-A) in register block (310-A). The address bus (PADDs) are incremented in a predetermined sequence. Address buses PADDs control the decoders (526), sequentially enabling the corresponding tri-state buffer (528), according to the aforementioned predetermined sequence. This allows the state of the e-fuse to be latched at node 'a' and to be sequentially transferred via the communication channel to the corresponding registers (312-A), i.e., CMOS latch 534. The node FS pre-charges during power-on since the low state of bFPUP couples node FS to the power supply through PMOS (532). Each register (312-A), controlled by the corresponding decoder (530), has an NMOS switch to couple node FS to ground. The NMOS switch opens only when the address buses selecting the decoder and data on the communication channel switch to high. PADDs are used by both, the decoders in the sequencer (320) and the registers (312-A) so that the data transfer phase from the sequencer (320) and the data receiving phase on the registers (312-A) are fully synchronized. In summary, by incrementing PADDs, the state of the e-fuse programmed within the e-fuse block (220) can be sequentially transferred to registers (410). This operation is preferably enabled immediately after power-on. Alternatively, this operation may be enabled by a special command applied to the chip.

(4) e-fuse Redundancy Replacement Mode

Figure 6:
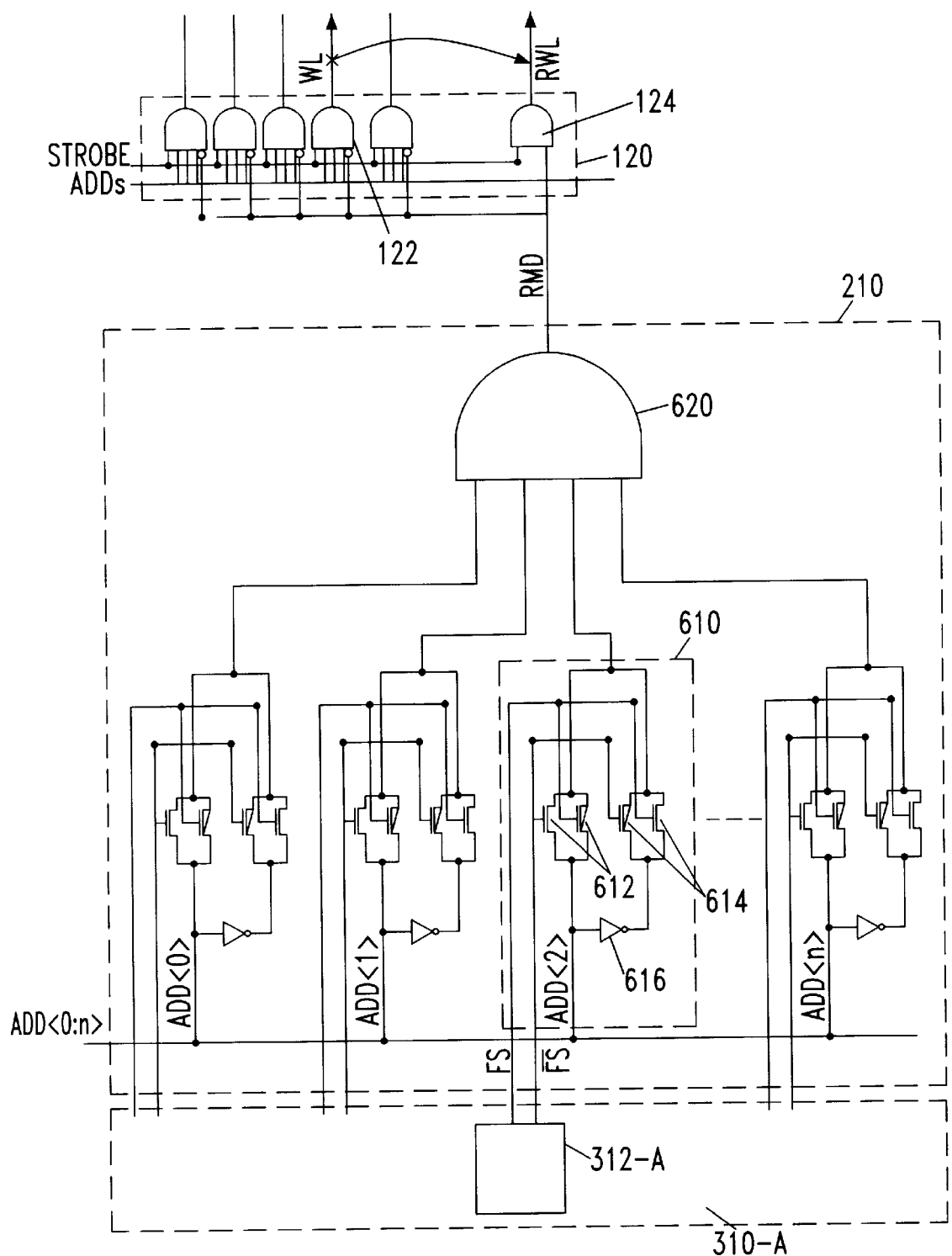
FIG. 6 shows a transistor level schematic of a redundancy match detection decoder, a plurality of the node from the registers coupled to at least one redundancy match detection decoder.

FIG. 6 shows a transistor level schematic of a redundancy match detection decoder (210). A plurality of the node FS and $\overline{FS}$ from registers (310-A) are coupled to at least one redundancy match detection decoder (210). More particularly, the FS and $\overline{FS}$ from each register couple CMOS transfer gates 612 and 614, configuring a 1 bit address comparator (610). When the FS and $\overline{FS}$ are low and high, the transfer gate 612 opens, coupling the address input (ADD) to the input of the decoder (620). When the FS and $\overline{FS}$ are high and low, respectively, transfer gate 614 opens, coupling the complemented address (ADD) to the input of the decoder (620). Thus, the input of decoder (620) is at low if the states of FS and ADD are both at low or high, acting as an exclusive-OR. Exclusive-OR (610) enables the function of a 1-bit address comparator to correlate the address input (ADD) to a pre-programmed fuse address. The decoder (620) couples the output of the 1-bit address comparator (610), switching the output signal RMD to high only when all the addresses match the pre-programmed address. Otherwise, RMD is kept at low. When RMD is at low, the WL is activated according to the decoding result by the corresponding row decoder (122) when the STROBE signal switches to high, i.e., the normal mode. When RMD is at high, it is not possible to activate WL, no matter the decoding results. On the other hand, the redundancy row decoder (124) is enabled, activating the corresponding redundancy wordline (RWL) when the STROBE signal switches to high. This is a redundancy replacement mode.

(5) e-fuse Verification Mode

The present invention further provides a method of verifying the fuse blowing state as it is done for EPROMs. As shown in FIG. 5, each peripheral fuse latch (510) includes a tri-state buffer (514) which couples the node 'b' in the fuse latch to the data buses (RWDs) when signal EFRD (e-fuse read) switches to high. This allows the state of the fuse to be simultaneously read on the RWDs. Optionally, the fuse states stored in the node 'b' can be read out sequentially by adding extra decoders or shift registers. The data on the RWDs can be read from the corresponding I/Os similar to the chip read mode. In this operation, the array data transfer is disabled so that data on the RWDs is determined only by the state of the e-fuses.

While the invention has been discussed in terms of a preferred embodiment, those skilled in the art will recognize that the invention can be practiced with changes and modifications, all of which remain within the scope and spirit of the appended claims.

Having thus described the invention, what is claimed as new and desired to be secured by Letters Patent is as follows:

1. A memory device comprising:
   a plurality of data storage means;
   at least one redundancy data storage means;
   a programmable fuse means for identifying defective ones of said at least one data storage means;
   a redundancy match detection means; and
   time multiplexing means for coupling said programmable fuse means to said redundancy match detection means, wherein a defective one of said plurality of data storage means is replaced by said at least one redundancy data storage means when said redundancy match detection means detects a pre-determined condition set by said programmable fuse means.

2. The memory device as recited in claim 1, wherein said memory device is selected from the group consisting of a Dynamic Random Access Memory (DRAM), a Static Random Access Memory (SRAM), Content Addressable Memory (CAM), and a non-volatile Random Access Memory (NVRAM).

3. The memory device as recited in claim 1, wherein each of said data storage means and said redundancy storage means consist of a plurality of memory cells integral to said DRAM, SRAM, CAM, or NVRAM.

4. The memory device as recited in claim 1, wherein said programmable fuse means is an electrically programmable fuse.

5. The memory device as recited in claim 4, wherein said programmable means is enabled by applying a voltage to a selected one of said electrically programmable fuses, rendering it non-conductive.

6. The memory device as recited in claim 4, wherein said programmable means is enabled by applying a voltage to a selected at least one of said electrically programmable fuses, rendering it conductive, thereby acting as an anti-fuse.

7. The memory device as recited in claim 4, wherein said programmable fuse means is selected by a plurality of data buses.

8. The memory device as recited in claim 7, wherein each of said data buses is controlled by an input of said memory device or said control is shared between an input and an output of said memory device.

9. The memory device as recited in claim 8, wherein control of each of said data buses is exercised during a write mode operation of said memory device.

10. The memory device as recited in claim 4, wherein said electrical fuse is selected by coupling said electrical fuse to a power supply.

11. The memory device as recited in claim 3, wherein said redundancy match detection means is enabled by comparing an address input with a pre-programmed address identified by said programmable fuse means.

12. The memory device as recited in claim 3, wherein said programmable fuse means includes first latches for storing a state of said fuse following powering said memory device, and said redundancy match detection means includes second latches for storing a pre-programmed address identified by said first latches.

13. The memory device as recited in claim 12, wherein said means for coupling said programmable fuse means to said redundancy match detection means is enabled by a time multiplexing means.

14. The memory device as recited in claim 13, wherein said time multiplexing means is enabled by said first and said second latches.

15. The memory device as recited in claim 3, wherein said means for coupling said programmable fuse means to said redundancy match detection means is enabled by a time shift register.

16. The memory device as recited in claim 3 further comprising a means for reading the state of a fuse within said programmable fuse means.

17. The memory device as recited in claim 16, wherein said means for reading the state of said fuse is enabled by transferring the state of said fuse to the input of the memory device or is enabled by sharing through said data bus an input and an output port of said memory device.

18. The memory device as recited in claim 17, wherein said means reading the state of said fuse occurs during a read mode operation of said memory device.

19. The memory device as recited in claim 3, wherein said programmable fuse means and said redundancy match detection means are arranged, respectively, in a peripheral area and in an area occupied by said array.

20. The memory device as recited in claim 1, wherein said programmable fuse means enable redundancy means and repair means.

21. A memory device comprising:
   a plurality of data storage means;
   at least one redundancy data storage means;
   a programmable fuse means for identifying defective ones of said plurality of data storage means, said programmable fuse means being controlled by an input data port or by an input and output data port of said memory device;
   a redundancy match detection means; and
   a means for coupling said programmable fuse means to said redundancy match detection means, wherein a redundancy replacement means replaces a defective one of said data storage means with said at least one redundancy data storage means when said redundancy match detection means detects a predetermined condition to access said data storage means identified by said programmable fuse means.

22. The memory device as recited in claim 21 further comprising a means for reading the state of said programmed fuse in said programmable fuse means from said input data port or said input and output data port of said memory device.

* * * * *

UNITED STATES PATENT AND TRADEMARK OFFICE
CERTIFICATE OF CORRECTION

PATENT NO. : 6,166,981
DATED : December 26, 2000
INVENTOR(S) : Toshiaki Kirihata, Gabriel Daniel It is certified that error appears in the above-identified patent and that said Letters Patent is hereby corrected as shown below:

Column 4,
Line 31, delete "(320-B)" and insert in its stead -- (220) --.

Claim 1,(column 7),
Line 18, delete "said at least one data storage means" and insert in its stead -- said plurality of data storage means --.

Signed and Sealed this

Thirtieth Day of October, 2001

Attest:

NICHOLAS P. GODICI
Attesting Officer     Acting Director of the United States Patent and Trademark Office